(12) United States Patent
Chen

(10) Patent No.: US 7,271,424 B2
(45) Date of Patent: Sep. 18, 2007

(54) LIGHT-EMITTING DIODE WITH OPENINGS FORMED IN A STACKED STRUCTURE

(75) Inventor: Shi-Ming Chen, 9F, No.23, Tung Ping Rd., East Dist., Tainan County (TW)

(73) Assignees: Epitech Technology Corporation, Tainan County (TW); Shi-Ming Chen, Tainan (TW)

( * ) Notice: Subject to any disclaimer, the term of this patent is extended or adjusted under 35 U.S.C. 154(b) by 72 days.

(21) Appl. No.: 11/259,785

(22) Filed: Oct. 27, 2005

(65) Prior Publication Data

US 2007/0001183 A1    Jan. 4, 2007

(30) Foreign Application Priority Data

Jul. 1, 2005    (TW) ............................. 94122446 A

(51) Int. Cl.
*H01L 29/225* (2006.01)
*H01L 33/00* (2006.01)
*H01L 29/22* (2006.01)
*H01L 29/227* (2006.01)

(52) U.S. Cl. .......................................... 257/98; 257/97
(58) Field of Classification Search ................ 257/98, 257/76, 97
See application file for complete search history.

(56) References Cited

U.S. PATENT DOCUMENTS

| 5,376,580 | A | 12/1994 | Kish et al. | |
|---|---|---|---|---|
| 5,498,883 | A * | 3/1996 | Lebby et al. | 257/95 |
| 5,717,226 | A * | 2/1998 | Lee et al. | 257/86 |
| 6,958,494 | B2 * | 10/2005 | Lin et al. | 257/86 |
| 2001/0011730 | A1 * | 8/2001 | Saeki | 257/79 |
| 2002/0123164 | A1 * | 9/2002 | Slater et al. | 438/39 |
| 2003/0179978 | A1 * | 9/2003 | Iwasaki | 385/14 |

* cited by examiner

*Primary Examiner*—Richard T. Elms
*Assistant Examiner*—Allison P Bernstein
(74) *Attorney, Agent, or Firm*—Kinney & Lange, PA

(57) ABSTRACT

A light-emitting diode has a sub-mount, a first conductivity type substrate deposed on the sub-mount, a reflector layer deposed between the sub-mount and the first conductivity type substrate, a first conductivity type buffer layer deposed on the first conductivity type substrate, a first conductivity type distributed Bragg reflector (DBR) layer deposed on the first conductivity type buffer layer, an illuminant epitaxial structure deposed on the first conductivity type distributed Bragg reflector layer, and a second conductivity type window layer deposed on the illuminant epitaxial structure.

27 Claims, 8 Drawing Sheets

LIGHT-EMITTING DIODE WITH OPENINGS FORMED IN A STACKED STRUCTURE

RELATED APPLICATIONS

The present application is based on, and claims priority from, Taiwan Application Serial Number 94122446, filed Jul. 1, 2005, the disclosure of which is hereby incorporated by reference herein in its entirety.

FIELD OF THE INVENTION

The present invention relates to a light-emitting diode (LED), and more particularly, a light-emitting diode including a GaAs substrate, which is removed locally.

BACKGROUND OF THE INVENTION

In a conventional bonding method of a light-emitting diode chip, such as the disclosure in U.S. Pat. No. 5,376,580, bubbles are easily produced at the bonding interface, so the bonding interface is easily separated during the manufacturing process, the yield is reduced, and the light-emitting diode is difficult to be produced massively.

For example, FIGS. 1a through 1d are schematic flow diagrams showing the process for manufacturing a conventional light-emitting diode. A substrate 100 is provided. An n-type semiconductor layer 102, an active layer 104 and a p-type semiconductor layer 106 are grown on the substrate 100 by an epitaxy method in sequence, in which the n-type semiconductor layer 102, the active layer 104 and the p-type semiconductor layer 106 comprise an illuminant epitaxial structure 108, such as shown in FIG. 1a. The substrate 100 may be made of sapphire.

An electrically conductible substrate 110 is provided, and an adhesion layer 112 is formed on a surface of the substrate 110, such as shown in FIG. 1b. Next, a wafer bonding step is performed to adhere the substrate 110 to the p-type semiconductor layer 106 by the adhesion layer 112 for achieving the connection of the substrate 110 and the illuminant epitaxial structure 108, such as shown in FIG. 1c. Then, the electrically insulating substrate 100 is removed to complete the manufacturing of a light-emitting diode 114, such as shown in FIG. 1d.

However, in such a bonding technique, bubbles are easily produced at the bonding interface between the illuminant epitaxial structure 108 and the adhesion layer 112 when the bonding step is performed. The existence of the bubbles greatly degrade the bonding strength. Due to the insufficient bonding strength, the substrate 110 very easily falls off the illuminant epitaxial structure 108 or chip, thereby degrading the yield of the sequent processes.

SUMMARY OF THE INVENTION

Therefore, one objective of the present invention is to provide a light-emitting diode, in which a plurality of openings are formed in the stacked structure composed of a growth substrate and a buffer layer and/or a distributed Bragg reflector (DBR) layer, thereby can effectively increase the heat-dissipating capability of the device, and can greatly enhance the current-spreading effect.

Another objective of the present invention is to provide a light-emitting diode, in which only a portion thickness of a growth substrate for the growth of an illuminant epitaxial structure is removed. The growth substrate is not completely removed, so that the device has a superior ohmic metal-semiconductor contact property.

Still another objective of the present invention is to provide a light-emitting diode, in which a plurality of openings are formed in a bonding surface of a growth substrate, and the openings can provide space for the escape of the bubbles produced at the bonding interface during bonding, thereby preventing the bubbles from being placed at the bonding interface. The bonding force can thus be enhanced, thereby effectively enhancing the production yield.

According to the aforementioned objectives, the present invention provides a light-emitting diode, comprising the following elements. A sub-mount is provided. A first conductivity type substrate is deposed on the sub-mount. A reflector layer is deposed between the sub-mount and the first conductivity type substrate. A first conductivity type buffer layer is deposed on the first conductivity type substrate. A first conductivity type distributed Bragg reflector layer is deposed on the first conductivity type buffer layer. A first conductivity type cladding layer is deposed on the first conductivity type distributed Bragg reflector layer. An active layer is deposed on the first conductivity type cladding layer. A second conductivity type cladding layer is deposed on the active layer. A second conductivity type window layer is deposed on the second conductivity type cladding layer.

According to a preferred embodiment of the present invention, a plurality of openings are formed in a stacked structure composed of the first conductivity type substrate, the first conductivity type buffer layer and/or the first conductivity type distributed Bragg reflector layer, to expose a portion of the first conductivity type distributed Bragg reflector layer or a portion of the first conductivity type cladding layer, and the reflector layer conformally covers on the stacked structure. The sub-mount further comprises a metal layer and/or a conductive organic polymer layer, and the materials of the metal layer and the conductive organic polymer layer are different from that of the sub-mount, in which the material of the metal layer may be, for example, Au, Al, Ag or any alloy thereof, and the material of the conductive organic polymer layer may be, for example, polyimide.

By forming many openings in the stacked structure composed of the growth substrate and the buffer layer and/or the distributed Bragg reflector layer, and reserving a portion of the growth substrate, the light-emitting diode device can have a superior heat-dissipating property, a better current-spreading effect and a superior ohmic metal-semiconductor contact property, thereby can greatly reduce the amount of the bubbles remaining at the bonding interface, and can achieve the object of enhancing the process yield.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a light-emitting diode, not only having a superior heat-dissipating property, a better current-spreading effect and a superior ohmic metal-semiconductor contact property, but also preventing bubbles produced at the bonding interface during a bonding process from remaining, thereby increasing the process yield and the product reliability. In order to make the illustration of the present invention more explicit and complete, the following description is stated with reference to FIGS. 2a through 3f.

Figure 1A:
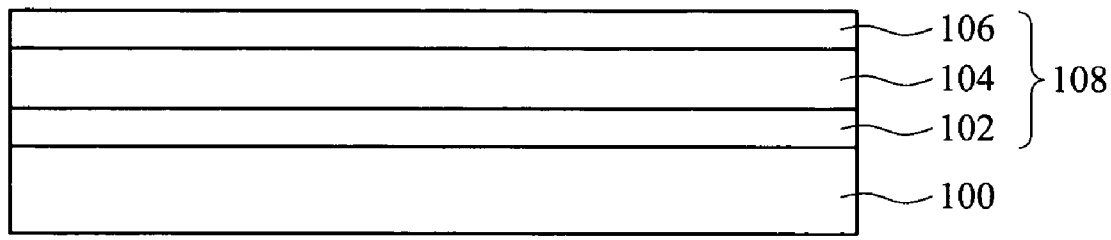
FIGS. 1a through 1d are schematic flow diagrams showing the process for manufacturing a conventional light-emitting diode.
Figure 1B:
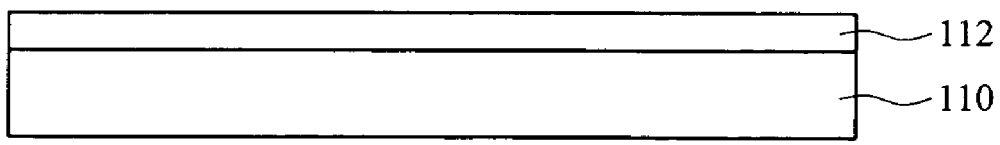
Figure 1C:
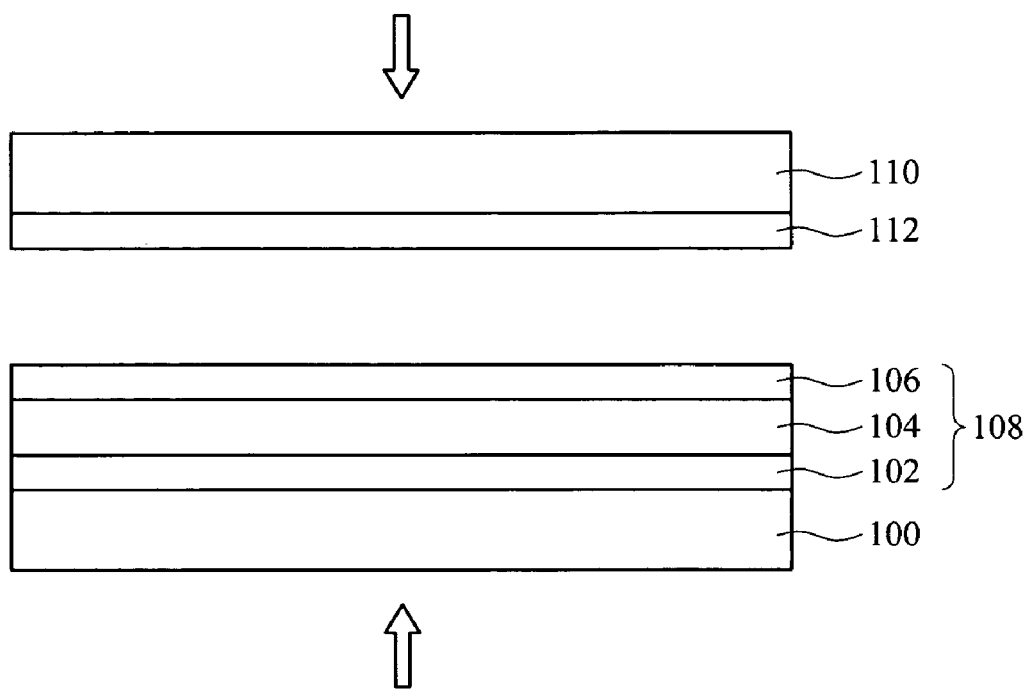
Figure 1D:
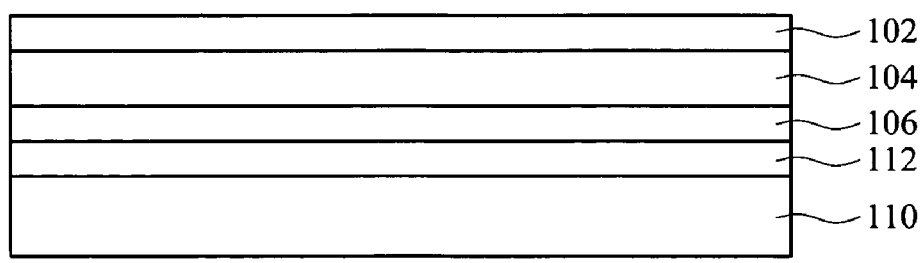
Figure 2A:
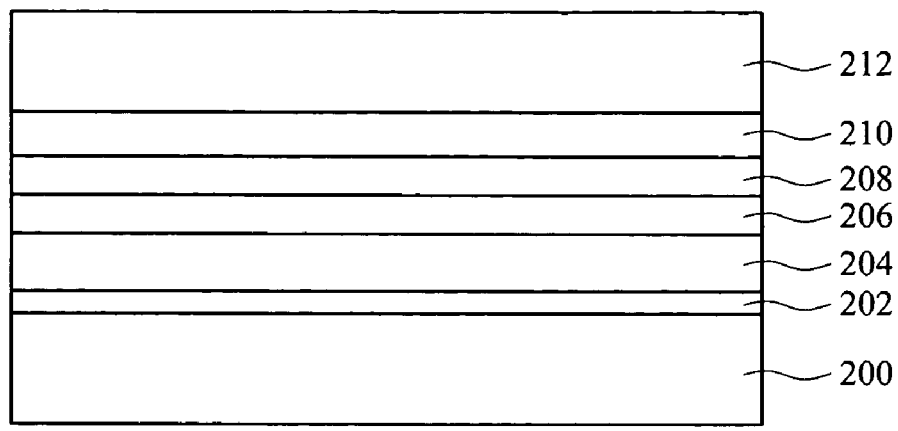
FIGS. 2a through 2f are schematic flow diagrams showing the process for manufacturing a light-emitting diode in accordance with a preferred embodiment of the present invention.

FIGS. 2a through 2f are schematic flow diagrams showing the process for manufacturing a light-emitting diode in accordance with a preferred embodiment of the present invention. In the manufacturing of the light-emitting diode of the present embodiment, a first conductivity type substrate 200 for various epitaxial material layers formed thereon is provided, in which a material of the first conductivity type substrate 200 may be GaAs. Next, a first conductivity type buffer layer 202 is formed on the first conductivity type substrate 200, in which a material of the first conductivity type buffer layer 202 may be GaAs. A first conductivity type distributed Bragg reflector layer 204 is formed by, for example, an epitaxy method, in which the first conductivity type distributed Bragg reflector layer 204 is composed of a multi-layer stacked structure. Similarly, a first conductivity type cladding layer 206, an active layer 208 and a second conductivity type cladding layer 210 are formed to stack on the first conductivity type distributed Bragg reflector layer 204 in sequence by, for example, an epitaxy method. The materials of the first conductivity type cladding layer 206 and the second conductivity type cladding layer 210 may be preferably AlGaInP, the active layer 208 may be preferably a multiple quantum well structure, which may be preferably composed of AlGaInP. In the present embodiment, the first conductivity type is n-type, and the second conductivity type is p-type. In the present invention, the first conductivity type and the second conductivity type are opposite conductivity types. In other words, when the first conductivity type is n-type, the second conductivity type is p-type; when the first conductivity type is p-type, the second conductivity type is n-type. Sequentially, a second conductivity type window layer 212 is formed to stack on the second conductivity type cladding layer 210, so a structure such as illustrated in FIG. 2a is formed. The material of the second conductivity type window layer 212 may be GaP, GaN or ITO. In the present embodiment, the second conductivity type window layer 212 is of a larger thickness, which is preferably about 100 µm, for providing a structural support in the following processes.

Figure 2B:
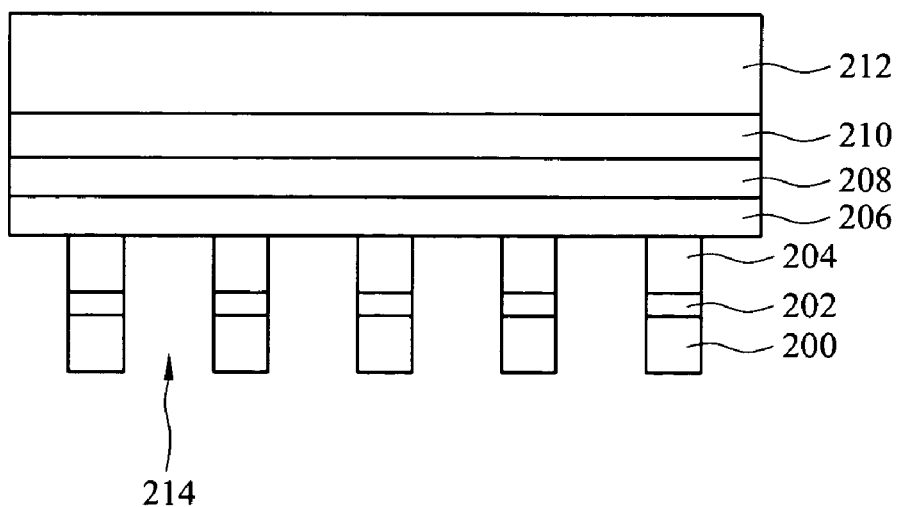
Figure 2C:
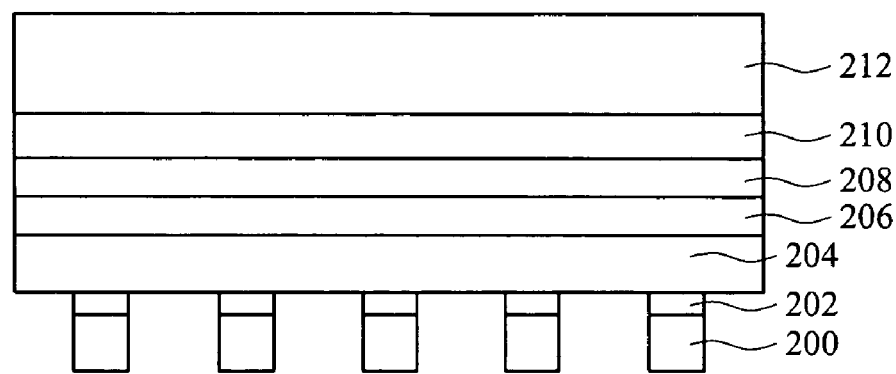

After the second conductivity type window layer 212 is formed, the thickness of the first conductivity type substrate 200 is reduced by, for example, a polishing method. The thickness of the polished first conductivity type substrate 200 is preferably less than about 200 µm. Local areas of the stacked structure composed of the first conductivity type substrate 200, first conductivity type buffer layer 202 and the first conductivity type distributed Bragg reflector layer 204 are removed by, for example, an etching method, so as to form a plurality of openings 214 in the stacked structure. The bottoms of the openings 214 expose a portion of the first conductivity type cladding layer 206, such as shown in FIG. 2b. In other embodiments of the present invention, local areas of the stacked structure only composed of the first conductivity type substrate 200 and first conductivity type buffer layer 202 are removed to form a plurality of openings 214 in the stacked structure, in which the bottoms of the openings 214 expose a portion of the first conductivity type distributed Bragg reflector layer 204, such as shown in FIG. 2c.

Figure 2D:
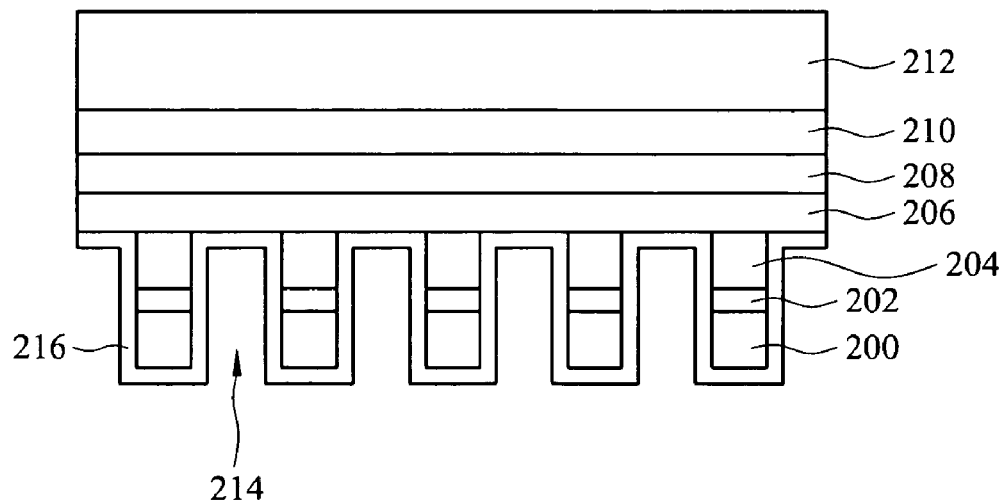

After the openings 214 are formed, a reflector layer 216 is formed by, for example, a deposition method, to conformally cover the stacked structure, such as shown in FIG. 2d. In a preferred embodiment, the reflector layer 216 may be composed of a single-layer high reflective metal material layer or a multi-layer metal stacked structure, in which the material of the high reflective metal material layer is preferably Au, Al, Ag or any alloy thereof. In another preferred embodiment, the reflector layer 216 may be composed of a multi-layer transparent conductive stacked structure, in which the transparent conductive material layers are several conductive layers, in which refractive indexes of the conductive layers are more different to each other. For example, the reflector layer 216 may be formed by stacking several ITO/ZnO structures.

One feature of the present invention is that after the epitaxy procedures of the material layers are completed, the growth substrate, i.e. the first conductivity type substrate 200, for the epitaxial layers growing thereon is not removed completed, and only a portion of the growth substrate is removed in thickness, so that the first conductivity type substrate 200 and the metal reflective material, such as the reflector layer 216 shown in FIG. 2d, covering the first conductivity type substrate 200 sequentially can achieve better metal-semiconductor ohmic contact property.

Figure 2E:
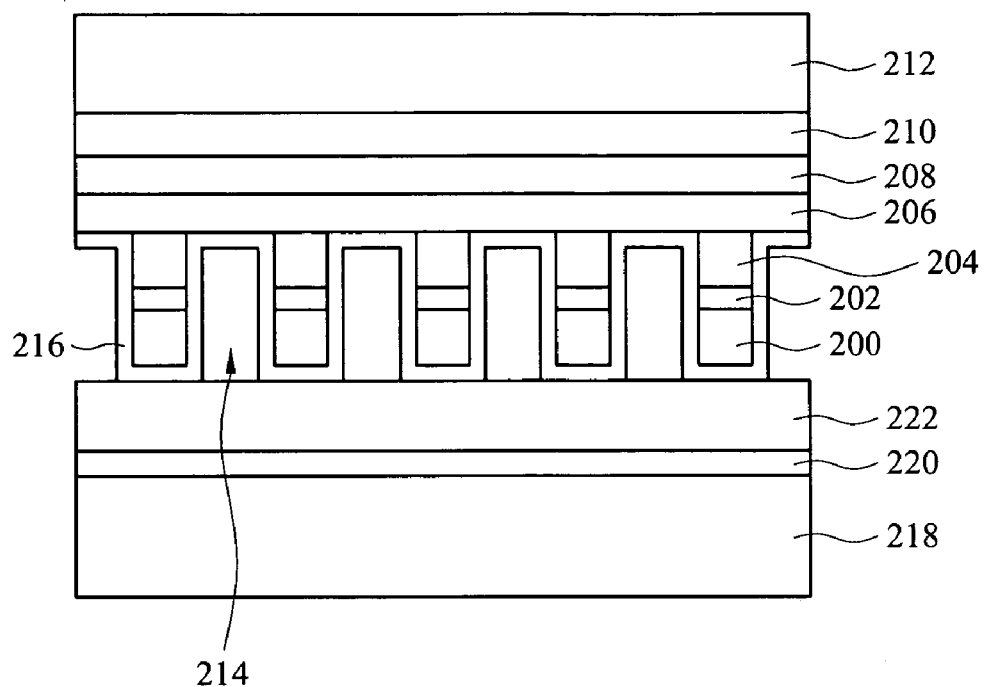
Figure 2F:
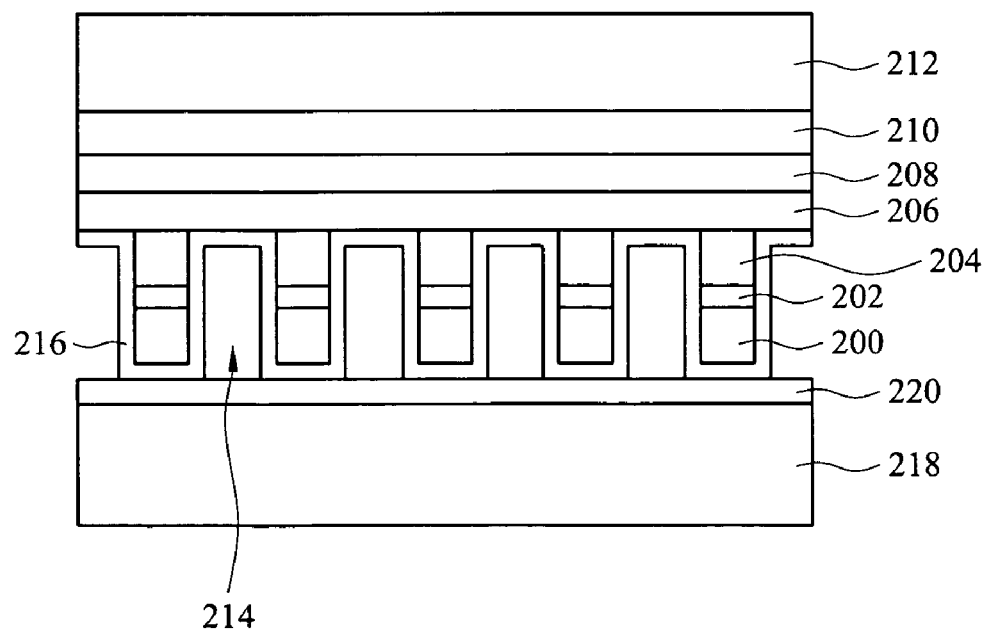

Simultaneously, a sub-mount 218 is provided, in which the material of the sub-mount 218 may be a semiconductor material, such as Si or GaP, or a metal material. In one preferred embodiment of the present invention, a metal layer 220 is formed on a surface of the sub-mount 218 by, for example, an electroplating method, and a conductive organic polymer layer 222 is formed on the metal layer 220, such as shown in FIG. 2e, by, for example, a deposition method. The materials of the metal layer 220 and the conductive organic polymer layer 222 are different from that of the sub-mount 218, in which the material of the conductive organic polymer layer 222 may be, for example, polyimide. In another preferred embodiment of the present invention, only the metal layer 220 is formed on the surface of the sub-mount 218, such as shown in FIG. 2f. In other preferred embodiment of the present invention, only a layer of a conductive organic polymer material, which is different from that of the sub-mount 218, is formed to cover the surface of the sub-mount 218. Next, the sub-mount 218 is adhered to the first conductivity type substrate 200 through the metal layer 220 on the sub-mount 218 and/or the conductive organic polymer layer 222, such as shown in FIG. 2e or 2f, by, for example, a wafer bonding method.

Another feature of the present invention is that many openings 214 are formed in the stacked structure composed of the first conductivity type substrate 200, the first conductivity type buffer layer 202 and/or the first conductivity type distributed Bragg reflector layer 204, so that bubbles induced at a bonding interface during the bonding of a surface of the first conductivity type substrate 200 and the sub-mount 218 (referring to FIG. 2e or 2f) can escape through the openings 214. Thus, the bubbles induced at the bonding interface can be greatly eliminated, which can effectively increase the bonding strength, thereby can enhance the production yield. Furthermore, with the openings 214, it can provide a better current-spreading effect to enhance the illuminant efficiency, and can increase the heat-dissipating area to enhance the heat-dissipating efficiency of the device.

Figure 3A:
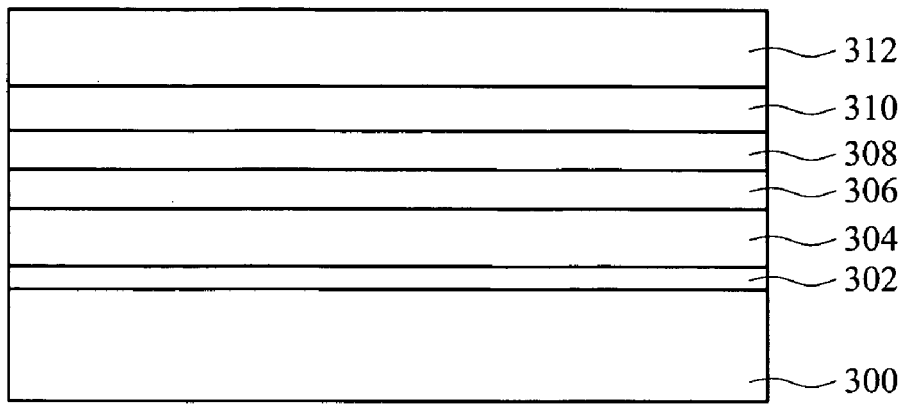
FIGS. 3a through 3f are schematic flow diagrams showing the process for manufacturing a light-emitting diode in accordance with another preferred embodiment of the present invention.

FIGS. 3a through 3f are schematic flow diagrams showing the process for manufacturing a light-emitting diode in accordance with another preferred embodiment of the present invention. In the present embodiment, a first conductivity type substrate 300 for various epitaxial material layers formed thereon is provided, in which a material of the first conductivity type substrate 300 may be GaAs. A first conductivity type buffer layer 302 is formed on the first conductivity type substrate 300, in which a material of the first conductivity type buffer layer 302 may be GaAs. Next, a first conductivity type distributed Bragg reflector layer 304 is formed by, for example, an epitaxy method, in which the first conductivity type distributed Bragg reflector layer 304 is composed of a multi-layer stacked structure. A first conductivity type cladding layer 306, an active layer 308 and a second conductivity type cladding layer 310 are formed to stack on the first conductivity type distributed Bragg reflector layer 304 in sequence by, for example, an epitaxy method. The materials of the first conductivity type cladding layer 306 and the second conductivity type cladding layer 310 may be preferably AlGaInP, the active layer 308 may be preferably a multiple quantum well structure, which may be preferably composed of AlGaInP. In the present invention, the first conductivity type and the second conductivity type are opposite conductivity types. In the present embodiment, the first conductivity type is n-type, and the second conductivity type is p-type. Sequentially, a second conductivity type window layer 312 is formed to stack on the second conductivity type cladding layer 310, so a structure such as illustrated in FIG. 3a is formed. The material of the second conductivity type window layer 312 may be GaP, GaN or ITO. In the present embodiment, the second conductivity type window layer 312 is of a smaller thickness, which may be as small as about 6 μm.

Figure 3B:
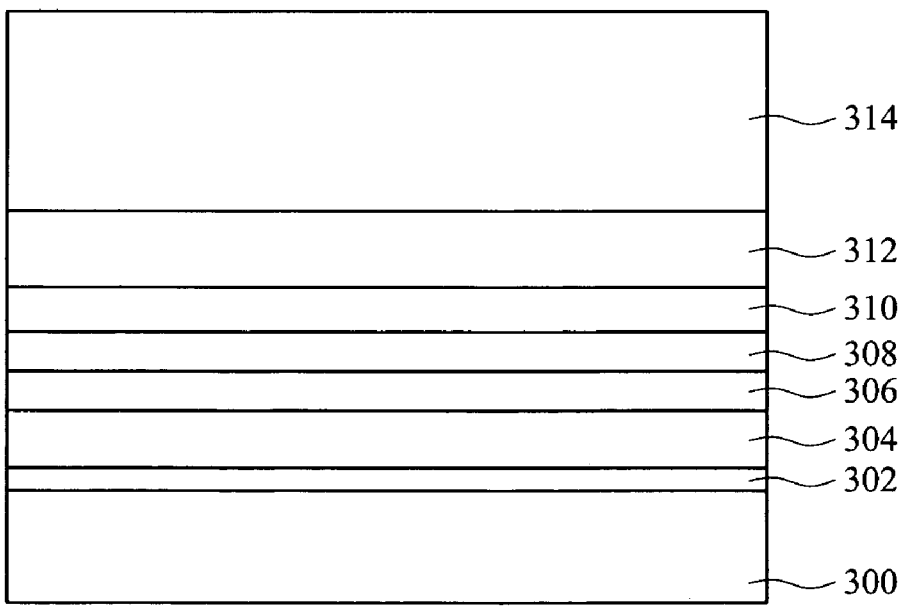
Figure 3C:
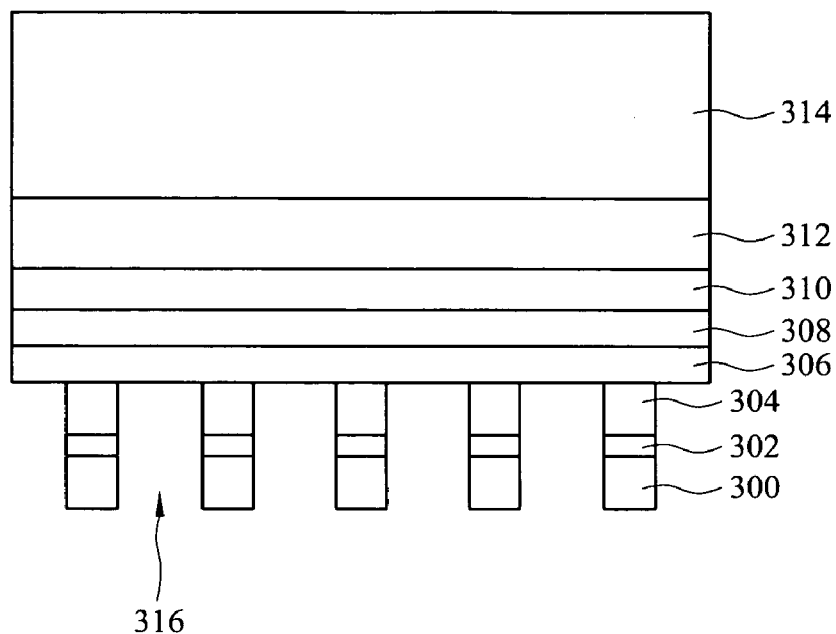

Referring to FIG. 3b, because the second conductivity type window layer 312 is thinner, and cannot have a sufficient structural support in the following processes, a temporary substrate 314 is provided on the second conductivity type window layer 312 for the benefit of the following processes by, for example, a pasting method. Next, the thickness of the first conductivity type substrate 300 is reduced by, for example, a polishing method. The thickness of the polished first conductivity type substrate 300 is preferably less than about 200 μm. Local areas of the stacked structure composed of the first conductivity type substrate 300 and first conductivity type buffer layer 302 are removed by, for example, an etching method, so as to form a plurality of openings 316 in the stacked structure, and to expose a portion of the first conductivity type distributed Bragg reflector layer 304, such as shown in FIG. 3c.

Figure 3D:
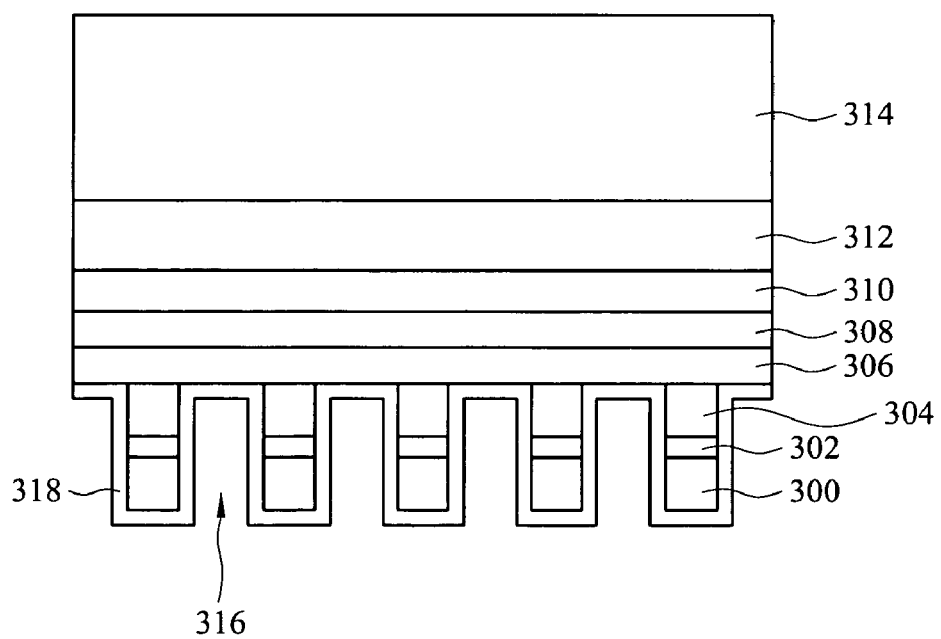

After the openings 316 are formed, a reflector layer 318 is formed by, for example, a deposition method, to conformally cover the stacked structure, such as shown in FIG. 3d. In a preferred embodiment, the reflector layer 318 may be composed of a single-layer high reflective metal material layer or a multi-layer metal stacked structure, in which the material of the high reflective metal material layer is preferably Au, Al, Ag or any alloy thereof. In another preferred embodiment, the reflector layer 318 may be composed of a multi-layer transparent conductive stacked structure, in which the transparent conductive material layers are several conductive layers, in which refractive indexes of the conductive layers are more different to each other. For example, the reflector layer 318 may be formed by stacking several ITO/ZnO structures.

Figure 3E:
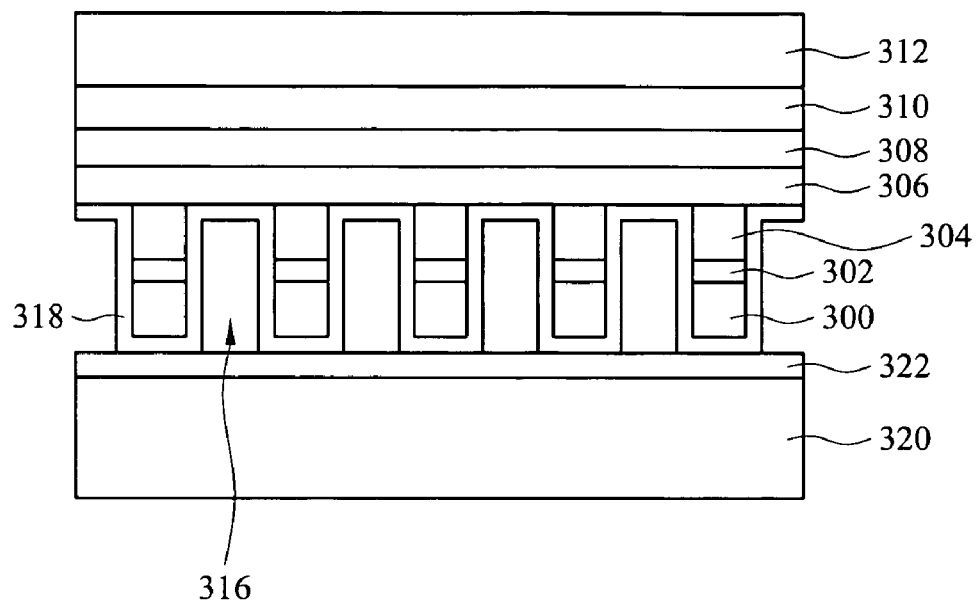
Figure 3F:
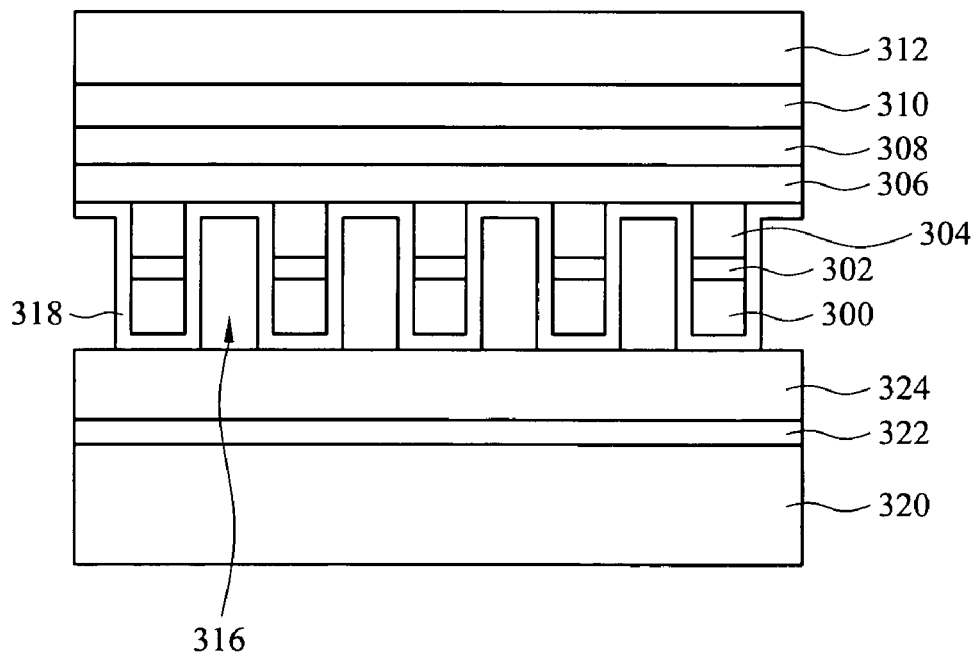

In the meanwhile, a sub-mount 320 is provided, in which the material of the sub-mount 320 may be a metal material or a semiconductor material, such as Si or GaP. In one preferred embodiment of the present invention, a metal layer 322 is formed on a surface of the sub-mount 320 by, for example, an electroplating method, such as shown in FIG. 3e. In another embodiment of the present invention, in addition to the metal layer 322, a conductive organic polymer layer 324 is further formed on the metal layer 322, such as shown in FIG. 3f, by, for example, a deposition method. The materials of the metal layer 322 and the conductive organic polymer layer 324 are different from that of the sub-mount 320, in which the material of the conductive organic polymer layer 324 may be, for example, polyimide. In another preferred embodiment of the present invention, only a layer of a conductive organic polymer material, which is different from that of the sub-mount 320, is formed to cover the surface of the sub-mount 320. Next, the sub-mount 320 is adhered to the first conductivity type substrate 300 through the metal layer 322 and/or the conductive organic polymer layer 324 on the sub-mount 320 by, for example, a wafer bonding method to bond the sub-mount 320 and the first conductivity type substrate 300. Then, the temporary substrate 314 is removed, so as to form the structure shown in FIG. 3e or 3f.

According to the aforementioned description, one advantage of the present invention is that a plurality of openings are formed in the stacked structure composed of a growth substrate and a buffer layer and/or a distributed Bragg reflector layer of the present light-emitting diode, so that the heat-dissipating capability of the device can be effectively increased, and the current-spreading effect of the device can be enhanced for a superior illuminant efficiency.

According to the aforementioned description, another advantage of the present invention is that a growth substrate is not removed completed, and only a portion thickness of the growth substrate is removed, so that the device has a superior ohmic metal-semiconductor contact property, thereby achieving the object of high electrical quality.

According to the aforementioned description, still another advantage of the present invention is that a plurality of openings are formed in a bonding surface of a growth substrate, and the openings can provide space for the escape of the bubbles produced at the bonding interface during bonding. The bonding force can thus be effectively enhanced, thereby achieving the object of high production yield As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A light-emitting diode, comprising:
a sub-mount;
a first conductivity type substrate deposed on the sub-mount;
a reflector layer deposed between the sub-mount and the first conductivity type substrate;

a first conductivity type buffer layer deposed on the first conductivity type substrate, wherein a plurality of openings are formed in a stacked structure, and the stacked structure comprises the first conductivity type substrate and the first conductivity type buffer layer, and the reflector layer conformally covers on the stacked structure;

a first conductivity type distributed Bragg reflector layer deposed on the first conductivity type buffer layer;

a first conductivity type cladding layer deposed on the first conductivity type distributed Bragg reflector layer;

an active layer deposed on the first conductivity type cladding layer;

a second conductivity type cladding layer deposed on the active layer; and a second conductivity type window layer deposed on the second conductivity type cladding layer.

2. The light-emitting diode according to claim 1, wherein the stacked structure is composed of the first conductivity type substrate, the first conductivity type buffer layer and the first conductivity type distributed Bragg reflector layer, the openings expose a portion of the first conductivity type cladding layer, and the reflector layer conformally covers on the stacked structure.

3. The light-emitting diode according to claim 1, wherein a material of the sub-mount is Si, GaP or metal.

4. The light-emitting diode according to claim 3, wherein the sub-mount further comprises a metal layer, and a material of the metal layer is different from the material of the sub-mount.

5. The light-emitting diode according to claim 3, wherein the sub-mount further comprises a conductive organic polymer layer, and a material of the conductive organic polymer layer is different from the material of the sub-mount.

6. The light-emitting diode according to claim 5, wherein the material of the conductive organic polymer layer is polyimide.

7. The light-emitting diode according to claim 3, wherein the sub-mount further comprises a stacked structure composed of a metal and a conductive organic polymer layer.

8. The light-emitting diode according to claim 1, wherein the reflector layer is a high reflective metal material layer, and a material of the high reflective metal material layer is selected from the group consisting of Au, Al, Ag and the alloys thereof.

9. The light-emitting diode according to claim 8, wherein the high reflective metal material layer is a multi-layer metal stacked structure.

10. The light-emitting diode according to claim 1, wherein the reflector layer is a transparent conductive stacked structure.

11. The light-emitting diode according to claim 10, wherein the reflector layer is composed of a plurality of ITO/ZnO stacked structures.

12. The light-emitting diode according to claim 1, wherein a thickness of the first conductivity type substrate is less than about 200 μm.

13. The light-emitting diode according to claim 1, wherein a material of the first conductivity type substrate is GaAs;

a material of the first conductivity type buffer layer is GaAs;

a material of the first conductivity type cladding layer is AlGaInP;

the active layer is a multiple quantum well structure, and a material of the active layer is AlGaInP;

a material of the second conductivity type cladding layer is AlGaInP; and a material of the second conductivity type window layer is GaP, GaN or ITO.

14. A light-emitting diode, comprising:

a sub-mount;

a first conductivity type substrate deposed on the sub-mount;

a first conductivity type buffer layer deposed on the first conductivity type substrate;

a first conductivity type distributed Bragg reflector layer deposed on the first conductivity type buffer layer, wherein a stacked structure composed of the first conductivity type substrate, the first conductivity type buffer layer and the first conductivity type distributed Bragg reflector layer comprises a plurality of openings formed therein, and the openings extend upwardly from the first conductivity type substrate to at least expose a portion of the first conductivity type distributed Bragg reflector layer;

a transparent film conformally covering on a bottom of the stacked structure and connecting the sub-mount and the first conductivity type substrate;

a first conductivity type cladding layer deposed on the first conductivity type distributed Bragg reflector layer;

an active layer deposed on the first conductivity type cladding layer;

a second conductivity type cladding layer deposed on the active layer; and a second conductivity type window layer deposed on the second conductivity type cladding layer.

15. The light-emitting diode according to claim 14, wherein bottoms of the openings expose a portion of the first conductivity type cladding layer.

16. The light-emitting diode according to claim 14, wherein a material of the sub-mount is Si, GaP or metal.

17. The light-emitting diode according to claim 16, wherein the sub-mount further comprises a metal layer, and a material of the metal layer is different from the material of the sub-mount.

18. The light-emitting diode according to claim 16, wherein the sub-mount further comprises a conductive organic polymer layer, and a material of the conductive organic polymer layer is different from the material of the sub-mount.

19. The light-emitting diode according to claim 18, wherein the material of the conductive organic polymer layer is polyimide.

20. The light-emitting diode according to claim 16, wherein the sub-mount further comprises a metal/conductive organic polymer stacked structure.

21. The light-emitting diode according to claim 14, wherein the transparent film is conductive.

22. The light-emitting diode according to claim 21, wherein the transparent film is a transparent metal layer, a material of the transparent metal layer is selected from the group consisting of Au, Al, Ag and the alloys thereof.

23. The light-emitting diode according to claim 21, wherein the transparent film is a multi-layer metal stacked structure.

24. The light-emitting diode according to claim 21, wherein the transparent film is an organic transparent conductive stacked structure.

25. The light-emitting diode according to claim 24, wherein the organic transparent conductive stacked structure is composed of a plurality of ITO/ZnO stacked structures.

26. The light-emitting diode according to claim 14, wherein a thickness of the first conductivity type substrate is less than about 200 μm.

27. The light-emitting diode according to claim 14, wherein
- a material of the first conductivity type substrate is GaAs;
- a material of the first conductivity type buffer layer is GaAs;
- a material of the first conductivity type cladding layer is AlGaInP;
- the active layer is a multiple quantum well structure, and a material of the active layer is AlGaInP;
- a material of the second conductivity type cladding layer is AlGaInP; and
- a material of the second conductivity type window layer is GaP, GaN or ITO.

* * * * *